(12) United States Patent
Ko et al.

(10) Patent No.: US 9,624,345 B2
(45) Date of Patent: *Apr. 18, 2017

(54) CURABLE COMPOSITION

(71) Applicant: LG CHEM, LTD., Seoul (KR)

(72) Inventors: Min Jin Ko, Daejeon (KR); Bum Gyu Choi, Daejeon (KR); Jae Ho Jung, Daejeon (KR); Dae Ho Kang, Daejeon (KR); Min Kyoun Kim, Daejeon (KR); Byung Kyu Cho, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/606,443

(22) Filed: Jan. 27, 2015

(65) Prior Publication Data

US 2015/0141608 A1    May 21, 2015

Related U.S. Application Data

(63) Continuation of application No. PCT/KR2013/006800, filed on Jul. 29, 2013.

(30) Foreign Application Priority Data

Jul. 27, 2012  (KR) .................. 10-2012-0082691
Jul. 29, 2013  (KR) .................. 10-2013-0089717

(51) Int. Cl.
| | |
|---|---|
| *H01L 23/29* | (2006.01) |
| *C08L 83/04* | (2006.01) |
| *C08G 77/04* | (2006.01) |
| *H01L 33/56* | (2010.01) |
| *C08L 83/06* | (2006.01) |
| *C08G 77/14* | (2006.01) |
| *C08G 77/20* | (2006.01) |
| *C08G 77/00* | (2006.01) |

(52) U.S. Cl.
CPC .............. *C08G 77/04* (2013.01); *C08L 83/04* (2013.01); *C08L 83/06* (2013.01); *H01L 23/293* (2013.01); *H01L 23/296* (2013.01); *H01L 33/56* (2013.01); *C08G 77/14* (2013.01); *C08G 77/20* (2013.01); *C08G 77/80* (2013.01); *C08G 2190/00* (2013.01); *H01L 2924/0002* (2013.01)

(58) Field of Classification Search
None
See application file for complete search history.

(56) References Cited

U.S. PATENT DOCUMENTS

| | | | | |
|---|---|---|---|---|
| 4,339,564 | A | * 7/1982 | Okamura | .............. C08G 77/04 523/176 |
| 8,143,363 | B2 | 3/2012 | Taden et al. | |
| 8,158,265 | B2 | * 4/2012 | Kimura | ................. C08G 77/20 428/447 |
| 8,921,496 | B2 | * 12/2014 | Choi | ...................... H01L 33/56 257/788 |
| 2011/0254047 | A1 | * 10/2011 | Yoshitake | ............... C08L 83/04 257/100 |
| 2013/0221400 | A1 | * 8/2013 | Tanikawa | .............. H01L 23/296 257/99 |
| 2013/0296521 | A1 | 11/2013 | Choi et al. | |
| 2014/0088232 | A1 | * 3/2014 | Mochizuki | ............. H01L 33/56 524/261 |

FOREIGN PATENT DOCUMENTS

| | | |
|---|---|---|
| JP | 11-274571 A | 10/1999 |
| JP | 2001-196151 A | 7/2001 |
| JP | 2002-226551 A | 8/2002 |
| JP | 2005-76003 A | 3/2005 |
| JP | 2010-1335 A | 1/2010 |
| JP | 2011-190366 A | 9/2011 |
| JP | 2011-527356 A | 10/2011 |
| JP | 2012-12556 A | 1/2012 |
| JP | 2012-129316 A | 7/2012 |
| KR | 10-1114922 B1 | 2/2012 |
| KR | 10-2012-0080141 A | 7/2012 |
| WO | 2012/093907 A1 | 7/2012 |
| WO | WO 2012/093907 * | 7/2012 |
| WO | 2012/157330 A1 | 11/2012 |
| WO | 2012/093910 A2 | 12/2012 |
| WO | WO 2012/164636 A1 * | 12/2012 |
| WO | 2013-139547 A | 7/2013 |

OTHER PUBLICATIONS

Abstract for EP 489 390 A2 (Jun. 1992).*
International Search Report issued in International Application No. PCT/KR2013/006800 on Oct. 21, 2013, 2 pages.
Office Action issued in Chinese Patent Application No. 201380039718.5 on Apr. 5, 2016, with English translation, 16 pages.
Supplementary European Search Report issued in European Patent Application No. 13823902 on Feb. 1, 2016, 5 pages.
Database WPI, Week 201248, Thomson Scientific, London, GB, XP002753342, 2 pages.

* cited by examiner

*Primary Examiner* — Marc Zimmer
(74) *Attorney, Agent, or Firm* — Rothwell, Figg, Ernst & Manbeck, P.C.

(57) ABSTRACT

Provided are a curable composition and its use. The curable composition exhibits excellent processability and workability before curing, and excellent light extraction efficiency, hardness, thermal and shock resistance, moisture resistance, gas permeability, and adhesiveness after curing. In addition, the curable composition may provide a cured product that exhibits long-lasting durability and reliability even under harsh conditions, and does not causing whitening and surface stickiness.

13 Claims, No Drawings

CURABLE COMPOSITION

CROSS REFERENCE TO RELATED APPLICATIONS

The present application is a continuation of International Application No. PCT/KR2013/006800 with an international filing date of Jul. 29, 2013, which claims priority to and the benefit of Korean Patent Application No. 10-2012-0082691 filed on Jul. 27, 2012, and Korean Patent Application No. 10-2013-0089717 filed on Jul. 29, 2013, the disclosures of which are incorporated herein by reference in their entireties.

TECHNICAL FIELD

The present application relates to a curable composition and its use.

BACKGROUND ART

A light-emitting diode (LED), for example, particularly a blue or ultraviolet (UV) LED having an emission wavelength of approximately 250 nm to 550 nm, is a high-brightness product using a GaN-based compound semiconductor such as GaN, GaAlN, InGaN or InAlGaN. In addition, it is possible to form a high-quality full-color image by a method of combining red and green LEDs with a blue LED. For example, a technique of manufacturing a white LED by combining a blue or UV LED with a fluorescent material is known.

Such LEDs are widely used as backlights for liquid crystal displays (LCDs) or as lighting.

As an LED encapsulant, an epoxy resin having high adhesive strength and excellent mechanical durability is widely used. However, the epoxy resin has lower light transmittance in a blue light or UV ray region, and low heat and light resistance. For example, Japanese Patent Application Nos. H11-274571, 2001-196151 and 2002-226551 present techniques for solving the above-described problems. However, encapsulants disclosed in the above references do not have sufficient heat resistance and light resistance.

DISCLOSURE OF THE INVENTION

Technical Problem

The present application provides a curable composition and its use.

Technical Solution

One aspect of the present application provides a curable composition including components that can be cured by hydrosilylation, for example, a reaction between an aliphatic unsaturated bond and a hydrogen atom. For example, the curable composition may include a polymerization product including a polyorganosiloxane having a functional group including an aliphatic unsaturated bond (hereinafter, referred to as "polyorganosiloxane (A)").

The term "M unit" used herein may refer to a monofunctional siloxane unit possibly represented as ($R_3SiO_{1/2}$) in the art, the term "D unit" used herein may refer to a bifunctional siloxane unit possibly represented as ($R_2SiO_{2/2}$) in the art, the term "T unit" used herein may refer to a trifunctional siloxane unit possibly represented as ($RSiO_{3/2}$) in the art, and the term "Q unit" used herein may refer to a tetrafunctional siloxane unit possibly represented as ($SiO_{4/2}$). Here, R is a functional group binding to a silicon (Si) atom, and may be, for example, a hydrogen atom, a hydroxyl group, an epoxy group, an alkoxy group, or a monovalent hydrocarbon group.

The polyorganosiloxane (A) may have, for example, a linear or partially-crosslinked structure. The term "linear structure" may refer to a structure of a polyorganosiloxane composed of the M and D units. In addition, the term "partially-crosslinked structure" may refer to a sufficiently long linear structure of a polyorganosiloxane, which is derived from the D unit, and to which the T or Q unit, for example, the T unit, is partially introduced. In one embodiment, the polyorganosiloxane having a partially-crosslinked structure may refer to a polyorganosiloxane having a ratio (D/(D+T+Q)) of the D unit with respect to all D, T and Q units included in the polyorganosiloxane of 0.7 or more.

In one embodiment, the polyorganosiloxane (A) having a partially-crosslinked structure may include D and T units sharing one oxygen atom and linked to each other. The linked units may be represented by, for example, Formula 1.

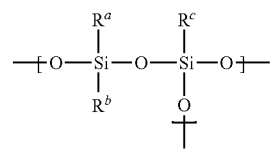

[Formula 1]

In Formula 1, $R^a$ and $R^b$ are each independently an alkyl group, an alkenyl group, or an aryl group, and $R^c$ is an alkyl group or an aryl group.

In Formula 1, $R^c$ and $R^b$ may be, for example, both simultaneously an alkyl group or an aryl group.

The polyorganosiloxane (A) having a partially-crosslinked structure may include at least one unit of Formula 1. The unit of Formula 1 is of a type in which a silicon atom of the D unit and a silicon atom of the T unit are directly bound by means of an oxygen atom among the siloxane units forming the polyorganosiloxane (A). For example, as will be described later, the polyorganosiloxane including the unit of Formula 1 may be prepared by polymerizing, for example, ring-opening polymerizing, a mixture including a cyclic siloxane compound. When the method is applied, a polyorganosiloxane including the unit of Formula 1 and having minimum amounts of silicon atoms binding to an alkoxy group and silicon atoms binding to a hydroxyl group in its structure may be prepared.

The polyorganosiloxane (A) may include at least one functional group including an aliphatic unsaturated bond, for example, at least one alkenyl group. For example, a ratio (Ak/Si) of moles of the functional group including an aliphatic unsaturated bond (Ak) and moles of all silicon atoms (Si) in the polyorganosiloxane (A) may be 0.01 to 0.2, or 0.02 to 0.15. As the molar ratio (Ak/Si) is controlled to 0.01 or more, or 0.02 or more, reactivity can be suitably maintained, and leakage of an unreacted component from a cured product can be prevented. In addition, as the molar ratio (Ak/Si) is controlled to 0.2 or less, or 0.15 or less, crack resistance of the cured product can be excellently maintained.

The polyorganosiloxane (A) may include an aryl group, for example, at least one aryl group binding to a silicon atom. For example, when the polyorganosiloxane (A) has a linear structure, the aryl group may bind to a silicon atom of the D unit, and when the polyorganosiloxane (A) has a partially-crosslinked structure, the aryl group may bind to a silicon atom of the D unit and/or the T unit. In addition, a percentage (100×B/A) of a ratio of moles of the acryl group (B) with respect to moles of all functional groups binding to silicon in the polyorganosiloxane (A) may be approximately 30% to 60%. In addition, a ratio (D-Ar/D-Si) of moles of an aryl group included in the D unit (D-Ar) to moles of silicon atoms of all D units (D-Si) included in the polyorganosiloxane (A) may be, for example, 0.3 or more, and less than 0.65. Within such a range, the composition can have excellent processability and workability before curing, and can excellently maintain moisture resistance, light transmittance, refractive index, light extraction efficiency and hardness after curing. Particularly, as the percentage (100×B/A) is maintained at 30% or more, mechanical strength and gas permeability of the cured product may be suitably ensured, and as the percentage is maintained at 60% or less, the crack resistance of the cured product can be excellently maintained.

The polyorganosiloxane (A) may include a unit of Formula 2 and a unit of Formula 3 as D units.

$$(R^1R^2SiO_{2/2}) \quad [\text{Formula 2}]$$

$$(R^3_2SiO_{2/2}) \quad [\text{Formula 3}]$$

In Formulas 2 and 3, $R^1$ and $R^2$ are each independently an epoxy group or a monovalent hydrocarbon group, and $R^3$ is an aryl group. In one embodiment, the $R^1$ and $R^2$ are each independently an alkyl group.

The term "monovalent hydrocarbon group" used herein, unless particularly defined otherwise, may refer to a monovalent residue derived from an organic compound composed of carbon and hydrogen or a derivative thereof. For example, the monovalent hydrocarbon group may include 1 to 25 carbon atoms. The monovalent hydrocarbon group may be an alkyl group, an alkenyl group, an alkynyl group, or an aryl group.

The term "alkyl group" used herein may refer to, unless particularly defined otherwise, an alkyl group having 1 to 20, 1 to 16, 1 to 12, 1 to 8, or 1 to 4 carbon atoms. The alkyl group may have a linear, branched or cyclic structure. In addition, the alkyl group may be optionally substituted with at least one substituent.

The term "alkenyl group" used herein may refer to, unless particularly defined otherwise, an alkenyl group having 2 to 20, 2 to 16, 2 to 12, 2 to 8, or 2 to 4 carbon atoms. The alkenyl group may have a linear, branched or cyclic structure, and may be optionally substituted with at least one substituent.

The term "alkynyl group" used herein may refer to, unless particularly defined otherwise, an alkynyl group having 2 to 20, 2 to 16, 2 to 12, 2 to 8, or 2 to 4 carbon atoms. The alkynyl group may have a linear, branched or cyclic structure, and may be optionally substituted with at least one substituent.

The term "aryl group" used herein may refer to, unless particularly defined otherwise, a monovalent residue derived from a compound including a benzene ring or a structure in which at least two benzene rings are condensed or connected by a covalent bond with one or two carbon atoms or a derivative thereof. In the range of the aryl group, a functional group conventionally referred to as an aralkyl group or arylalkyl group may be included, in addition to a functional group conventionally referred to as an aryl group. The aryl group may be, for example, an aryl group having 6 to 25 carbon atoms, 6 to 21 carbon atoms, 6 to 18 carbon atoms, or 6 to 12 carbon atoms. The aryl group may be a phenyl group, a dichlorophenyl group, a chlorophenyl group, a phenylethyl group, a phenylpropyl group, a benzyl group, a tolyl group, a xylyl group, or a naphthyl group.

The term "epoxy group" used herein may refer to, unless particularly defined otherwise, a monovalent residue derived from a cyclic ether having three ring-forming atoms or a compound including the cyclic ether. The epoxy group may be a glycidyl group, an epoxyalkyl group, a glycidoxyalkyl group or an alicyclic epoxy group. An alicylic epoxy group may include a monovalent residue derived from a compound including an aliphatic hydrocarbon ring structure, and a structure of an epoxy group formed by two carbon atoms of the aliphatic hydrocarbon ring. The alicyclic epoxy group may be an alicyclic epoxy group having 6 to 12 carbon atoms, for example, a 3,4-epoxycyclohexylethyl group.

As a substituent that may be optionally substituted to an epoxy group, or a monovalent hydrocarbon group, a halogen such as chlorine or fluorine, a glycidyl group, an epoxyalkyl group, a glycidoxyalkyl group, an epoxy group such as an alicyclic epoxy group, an acryloyl group, a methacryloyl group, an isocyanate group, a thiol group, or a monovalent hydrocarbon group may be used, but the present application is not limited thereto.

In the polyorganosiloxane (A), a ratio (A/B) of moles (A) of the siloxane unit of Formula 2 to moles (B) of the siloxane unit of Formula 3 may be, for example, in the range of 0.1 to 2.0, 0.1 to 1.5, 0.2 to 1.5, or 0.2 to 1. Within such a range, a curable composition ensuring suitable physical properties according to an application can be provided. For example, a curable composition capable of providing an element that has excellent mechanical strength and no surface stickiness, exhibits long-lasting high light transmittance, and has lasting durability by controlling moisture and gas permeability can be provided.

The siloxane unit (D2) of Formula 3 may be included such that a percentage (100×D2/D) thereof with respect to all D units (D) included in the polyorganosiloxane (A) is 60% or more, more than 65%, or 70% or more. Within such a range, excellent mechanical strength, no surface stickiness, and lasting durability obtained by controlling moisture and gas permeability can be ensured.

The siloxane unit (D2) of Formula 3 may be included such that a percentage (100×D2/ArD) thereof with respect to a D unit including an aryl group binding to a silicon atom (ArD) among all D units included in the polyorganosiloxane (A) is approximately 70% or more, or 80% or more. Within such a range, the composition can exhibit excellent processability and workability before curing, and can excellently maintain mechanical strength, gas permeability, moisture resistance, light transmittance, refractive index, light extraction efficiency, and hardness after curing.

In one embodiment, the polyorganosiloxane (A) may have an average empirical formula of Formula 4.

$$(R^4_3SiO_{1/2})_a(R^4_2SiO_{2/2})_b(R^4SiO_{3/2})_c(SiO_{4/2})_d \quad [\text{Formula 4}]$$

In Formula 4, $R^4$ are each independently an epoxy group or a monovalent hydrocarbon group, at least one of $R^4$ is an alkenyl group, at least one of $R^4$ is an aryl group, a and b are each a positive number, c and d are each 0 or a positive number, and b/(b+c+d) is 0.65 to 1 or 0.7 to 1.

The expression "polyorganosiloxane is represented as a certain average empirical formula" used herein means that the polyorganosiloxane is a single component represented as a certain average empirical formula, or a mixture of at least two components, and an average of compositions of components in the mixture is represented as the average empirical formula.

In the Formula 4, at least one of $R^4$ is an alkenyl group, and at least one of $R^4$ is an aryl group. The alkenyl group and the aryl group may be, for example, included to satisfy the above-described molar ratio.

In the average empirical formula of Formula 4, a, b, c and d are molar ratios of respective siloxane units of the polyorganosiloxane (A). For example, when a sum (a+b+c+d) of the molar ratios is adjusted to be 1, a may be 0.01 to 0.15, b may be 0.65 to 0.97, c may be 0 to 0.30 or 0.01 to 0.30, and d may be 0 to 0.2. Here, b/(b+c+d) may be 0.65 to 1 or 0.7 to 1. When the polyorganosiloxane (A) has a partially-crosslinked structure, b/(b+c+d) may be approximately 0.65 to 0.97 or 0.7 to 0.97. As ratios of the siloxane units are controlled as described above, suitable physical properties according to an application can be ensured.

In another example, the polyorganosiloxane (A) may have an average empirical formula of Formula 5.

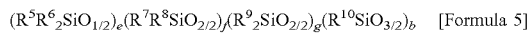  [Formula 5]

In Formula 5, $R^5$ is a monovalent hydrocarbon group, $R^6$ is an alkyl group having 1 to 4 carbon atoms, $R^7$ and $R^8$ are each independently an alkyl group, an alkenyl group, or an aryl group, $R^9$ is an aryl group, e is a positive number, f, g, and h are each 0 or a positive number, and (f+g)/(f+g+h) is 0.65 to 1 or 0.7 to 1.

In the average empirical formula of Formula 5, at least one of $R^5$ and $R^7$ to $R^9$ is an alkenyl group, and at least one of $R^5$ and $R^7$ to $R^9$ is an aryl group. The alkenyl group and the aryl group may be, for example, included to satisfy the above-described molar ratio.

In the average empirical formula of Formula 5, e, f, g and h are each a molar ratio of siloxane units of the polyorganosiloxane (A). For example, when a sum of the molar ratios (e+f+g+h) is adjusted to be 1, e may be 0.01 to 0.15, f may be 0 to 0.97, 0.3 to 0.97, or 0.65 to 0.97, g may be 0 to 0.97, 0.3 to 0.97, or 0.65 to 0.97, and h may be 0 to 0.30 or 0.01 to 0.30. Here, (f+g)/(f+g+h) may be 0.65 to 1 or 0.7 to 1. In a partially-crosslinked structure, (f+g)/(f+g+h) may be 0.65 to 0.97 or 0.7 to 0.97. As ratios of the siloxane units are controlled as described above, suitable physical properties according to an application can be ensured.

In the average empirical formula of Formula 5, f and g may not be 0. When f and g are not 0, f/g may be in the range of 0.1 to 2.0, 0.1 to 1.5, 0.2 to 1.5, or 0.2 to 1.

A polymerization product including the polyorganosiloxane (A) may be, for example, a ring-opening polymerization product of a mixture of a cyclic polyorganosiloxane. The polymerization product may include a cyclic compound, for example, a cyclic polyorganosiloxane having a weight average molecular weight (Mw) of 800 or less, 750 or less, or 700 or less. The cyclic compound is a component generated in ring-opening polymerization to be described later, and may remain in a desired ratio under conditions of ring-opening polymerization or through treatment of a polymerization product after the ring-opening polymerization. The cyclic compound may include, for example, at least a compound represented by Formula 6.

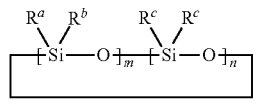  [Formula 6]

In Formula 6, $R^a$ and $R^b$ are each independently an epoxy group or a monovalent hydrocarbon group, and $R^c$ is an aryl group. In one embodiment, $R^a$ and $R^b$ are each independently an alkyl group. In addition, m may be 0 to 10, 0 to 8, 0 to 6, 1 to 10, 1 to 8, or 1 to 6, and n may be 0 to 10, 0 to 8, 0 to 6, 1 to 10, 1 to 8, or 1 to 6. In addition, the sum (m+n) of m and n may be 2 to 20, 2 to 16, 2 to 14, or 2 to 12.

According to a low molecular weight cyclic component including the above-described type of the cyclic compound, characteristics such as long-lasting reliability and crack resistance can be further improved.

The polymerization product may include the cyclic compound in a ratio of 10 weight % or less, 8 weight % or less, 7 weight % or less, 5 weight % or less, or 3 weight % or less. The ratio of the cyclic compound may be, for example, more than 0 weight %, or 1 weight % or more. By controlling the ratio as described above, a cured product having long-lasting reliability and excellent crack resistance can be provided. The term "weight average molecular weight" may refer to a conversion value with respect to standard polystyrene measured by gel permeation chromatography (GPC). Unless particularly defined otherwise, the term "molecular weight" used herein may refer to a weight average molecular weight.

In the polyorganosiloxane (A) or the polymerization product including the same, a ratio of an area of a peak derived from an alkoxy group binding to a silicon atom with respect to an area of a peak derived from a functional group containing an aliphatic unsaturated bond binding to a silicon atom, for example, an alkenyl group such as a vinyl group, in a spectrum obtained by $^1$H NMR, may be 0.01 or less, 0.005 or less, or 0. Within the above range, the polyorganosiloxane (A) or the polymerization product including the same can have suitable viscosity and maintain excellent other physical properties.

In addition, in one embodiment, the polyorganosiloxane (A) or the polymerization product including the same may have an acid value measured by KOH titration of 0.02 or less, 0.01 or less, or 0. Within the above range, the polyorganosiloxane (A) or the polymerization product including the same can have suitable viscosity and can excellently maintain other physical properties.

In one embodiment, the polyorganosiloxane (A) or the polymerization product including the same may have a viscosity at 25° C. of 500 cP or more, 1000 cP or more, or 5000 cP or more. Within the above range, processability and hardness can be suitably maintained. There is no particular upper limit on the viscosity, and the viscosity may be, for example, equal to 100000 cP or less, 90000 cP or less, 80000 cP or less, 70000 cP or less, or 65000 cP or less.

The polyorganosiloxane (A), or the polymerization product including the same may have a molecular weight of 800 to 50000, or 1000 to 30000. In such a range, moldability, hardness, and strength can be suitably maintained.

The polymerization product including the polyorganosiloxane (A) may be, for example, a ring-opening polymerization product of a mixture including a cyclic polyorganosiloxane.

When the polyorganosiloxane (A) has a partially-crosslinked structure, the mixture may further include, for example, a polyorganosiloxane having a cage or partial cage structure, or a polyorganosiloxane including a T unit.

As the cyclic polyorganosiloxane compound, for example, a compound represented by Formula 7 may be used.

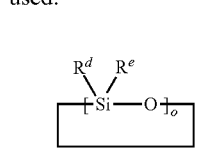  [Formula 7]

In Formula 7, $R^d$ and $R^e$ are each independently an epoxy group, or a monovalent hydrocarbon group, and o is 3 to 6.

The cyclic polyorganosiloxane may also include a compound of Formula 8 and a compound of Formula 9.

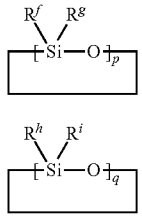

[Formula 8]

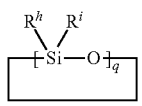

[Formula 9]

In Formulas 8 and 9, $R^f$ and $R^g$ are each an epoxy group or an alkyl group, $R^h$ and $R^i$ are each an epoxy group or an aryl group, p is a number of 3 to 6, and q is a number of 3 to 6.

In Formulas 7 to 9, specific kinds of $R^f$ to $R^i$ or specific values of o, p and q, and a ratio of components in the mixture, may be determined by a desired structure of the polyorganosiloxane (A).

When the polyorganosiloxane (A) has a partially-crosslinked structure, the mixture may further include, for example, a compound having an average empirical formula of Formula 10, or a compound having an average empirical formula of Formula 11.

[Formula 10]

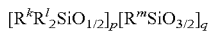

[Formula 11]

In Formulas 10 and 11, $R^j$, $R^k$ and $R^m$ are each independently an epoxy group or a monovalent hydrocarbon group, $R^l$ is an alkyl group having 1 to 4 carbon atoms, p is 1 to 3, and q is 1 to 10.

In Formulas 10 to 11, specific kinds of $R_j$ to $R^m$ or specific values of p and q, and a ratio of components in the mixture, may be determined by a desired structure of the polyorganosiloxane (A).

When the cyclic polyorganosiloxane reacts with a polyorganosiloxane having a cage or partial cage structure, or including a T unit, a polyorganosiloxane having a desired partially-crosslinked structure may be synthesized at a suitable molecular weight. In addition, according to the method, by minimizing a functional group such as an alkoxy group or a hydroxyl group binding to a silicon atom in the polyorganosiloxane or a polymerization product including the same, a desired product having excellent physical properties can be manufactured.

In one embodiment, the mixture may further include a compound represented by Formula 12.

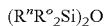

[Formula 12]

In Formula 12, $R^n$ and $R^o$ are each an epoxy group, or a monovalent hydrocarbon group.

In Formula 12, a specific kind of the monovalent hydrocarbon group or a blending ratio in the mixture may be determined by a desired polyorganosiloxane (A).

A reaction of each component in the mixture may be performed in the presence of a suitable catalyst. Accordingly, the mixture may further include a catalyst.

As the catalyst that can be included in the mixture, for example, a base catalyst may be used. A suitable base catalyst may be, but is not limited to, a metal hydroxide such as KOH, NaOH or CsOH; a metal silanolate including an alkali metal compound and a siloxane; or a quaternary ammonium compound such as tetramethylammonium hydroxide, tetraethylammonium hydroxide or tetrapropylammonium hydroxide.

A ratio of the catalyst in the mixture may be suitably selected in consideration of desired reactivity, and, for example, may be 0.01 to 30 parts by weight, or 0.03 to 5 parts by weight with respect to 100 parts by weight of a total weight of the reaction products in the mixture. In the specification, unless particularly defined otherwise, the units "parts by weight" refer to a weight ratio between components.

In one embodiment, the reaction may be performed under a solvent-free condition in which a solvent is not used, or in the presence of a suitable solvent. As a solvent, any kind of solvent in which the reaction product in the mixture, that is, a disiloxane or polysiloxane, may be suitably mixed with a catalyst and does not interfere with reactivity may be used. The solvent may be, but is not limited to, an aliphatic hydrocarbon-based solvent such as n-pentane, i-pentane, n-hexane, i-hexane, 2,2,4-trimethyl pentane, cyclohexane or methylcyclohexane; an aromatic solvent such as benzene, toluene, xylene, trimethyl benzene, ethyl benzene or methylethyl benzene; a ketone-based solvent such as methylethylketone, methylisobutylketone, diethylketone, methyl n-propyl ketone, methyl n-butyl ketone, cyclohexanone, methylcyclohexanone or acetylacetone; an ether-based solvent such as tetrahydrofuran, 2-methyl tetrahydrofuran, ethyl ether, n-propyl ether, isopropyl ether, diglyme, dioxine, dimethyldioxine, ethyleneglycol monomethyl ether, ethyleneglycol dimethyl ether, ethyleneglycol diethyl ether, propyleneglycol monomethyl ether or propyleneglycol dimethyl ether; an ester-based solvent such as diethyl carbonate, methyl acetate, ethyl acetate, ethyl lactate, ethyleneglycol monomethylether acetate, propyleneglycol monomethylether acetate or ethyleneglycol diacetate; or an amide-based solvent such as N-methyl pyrrolidone, formamide, N-methyl formamide, N-ethyl formamide, N,N-dimethyl acetamide or N,N-diethylacetamide.

The reaction may be performed by adding the catalyst to the reaction product. Here, a reaction temperature may be controlled within a range of, for example, 0° C. to 150° C., or 30° C. to 130° C. In addition, a reaction time may be controlled within a range of, for example, 1 hour to 3 days.

The curable composition may further include a crosslinkable polyorganosiloxane (hereinafter, referred to as "polyorganosiloxane (B)"). The term "crosslinkable polyorganosiloxane may refer to a polyorganosiloxane essentially including a T or Q unit as a siloxane unit, and having a ratio ((D/(D+T+Q)) of a D unit with respect to D, T and Q units of less than 0.65.

A crosslinkable polyorganosiloxane may have an average empirical formula of Formula 13.

[Formula 13]

In Formula 13, $R^{11}$ are each independently an epoxy group or a monovalent hydrocarbon group, at least one of $R^{11}$ is an alkenyl group, at least one of $R^{11}$ is an aryl group, a is a positive number, b is 0 or a positive number, c is a positive number, and d is 0 or a positive number, b/(b+c+d) is less than 0.65 or less, 0.4 or less, or 0.3 or less, and c/(c+d) is 0.8 or more.

In Formula 13, at least one or two of $R^{11}$ may be an alkenyl group. In one embodiment, the alkenyl group may be present in such an amount that a molar ratio (Ak/Si) of the alkenyl group (Ak) with respect to all silicon atoms (Si) included in the polyorganosiloxane (B) is 0.05 to 0.4 or 0.05 to 0.35. As the molar ratio (Ak/Si) is controlled to 0.05 or more, reactivity can be excellently maintained, and leakage of an unreacted component from a surface of the cured product can be prevented. In addition, by controlling the molar ratio (Ak/Si) to 0.4 or less, or 0.35 or less, the hardness, crack resistance, and thermal and shock resistance of the cured product can be excellently maintained.

In Formula 13, at least one of $R^{11}$ may be an aryl group. Accordingly, the refractive index and hardness of the cured product can be effectively controlled. The aryl group may be present in such an amount that a molar ratio (Ar/Si) of the aryl group (Ar) with respect to all silicon atoms (Si) included in the polyorganosiloxane (B) is 0.5 to 1.5, or 0.5 to 1.2. As the molar ratio (Ar/Si) is controlled to 0.5 or more, the refractive index and hardness of the cured product can be maximized. In addition, as the molar ratio (Ar/Si) is controlled to 1.5 or less, or 1.2 or less, the viscosity and thermal and shock resistance of the composition can be suitably maintained.

In the average empirical formula of Formula 13, a, b, c and d are molar ratios of respective siloxane units. For example, when the sum (a+b+c+d) thereof is adjusted to be 1, a is 0.05 to 0.5, b is 0 to 0.3, c is 0.6 to 0.95, and d is 0 to 0.2. To maximize strength, crack resistance and thermal and shock resistance of the cured product, (a+b)/(a+b+c+d) may be controlled to 0.2 to 0.7, b/(b+c+d) may be controlled to less than 0.65, 0.4 or less, or 0.3 or less, and c/(c+d) may be controlled to 0.8 or more. Here, the lower limit of b/(b+c+d) is not particularly limited and, for example, may be more than 0. In addition, the upper limit of c/(c+d) is not particularly limited and, for example, may be 1.0.

The polyorganosiloxane (B) may have a viscosity at 25° C. of 5000 cP or more, or 1000000 cP or more, and therefore processability before curing and hardness after curing can be suitably maintained.

The polyorganosiloxane (B) may have, for example, a molecular weight of 800 to 20,000, or 800 to 10,000. As the molecular weight is controlled to 800 or more, moldability before curing and strength after curing can be excellently maintained, and as the molecular weight is controlled to 20000 or less, or 10000 or less, the viscosity may be maintained at a suitable level.

A method of preparing the polyorganosiloxane (B) may be, for example, a method of preparing a polysiloxane conventionally known in the art, or a method similar to that of preparing the polyorganosiloxane (A).

The polyorganosiloxane (B) may be included such that, for example, a weight ratio (A/(A+B)) of the polyorganosiloxane (A) with respect to a mixture of the polyorganosiloxane (A) and the polyorganosiloxane (B) is approximately 10 to 50. In the above range, strength and thermal and shock resistance of the cured product can be excellently maintained, and surface stickiness can also be prevented.

The curable composition may further include a silicon compound including a hydrogen atom binding to a silicon atom (hereinafter, referred to as "silicon compound (C)"). The silicon compound (C) may have at least one or two hydrogen atoms.

The silicon compound (C) may serve as a crosslinking agent to crosslink a composition by a reaction with a functional group containing an aliphatic unsaturated bond of a polyorganosiloxane. For example, crosslinking and curing may be performed by addition-reacting a hydrogen atom of the silicon compound (C) and an alkenyl group of the polyorganosiloxane (A) or (B).

As the silicon compound (C), any one of various kinds of silicon compounds including a hydrogen atom binding to a silicon atom (Si—H) in a molecule may be used. The silicon compound (C) may be, for example, a linear, branched, cyclic, or crosslinkable organopolysiloxane. The silicon compound (C) may be a compound having 2 to 1000 silicon atoms, or preferably 3 to 300 silicon atoms.

The silicon compound (C) may be, for example, a compound of Formula 14, or a compound having an average empirical formula of Formula 15.

$R^{12}{}_3SiO(R^{12}{}_2SiO)_nSiR^{12}{}_3$ [Formula 14]

$(R^{13}{}_3SiO_{1/2})_a(R^{13}{}_2SiO_{2/2})_b(R^{13}SiO_{3/2})_c(SiO_2)_d$ [Formula 15]

In Formulas 14 and 15, $R^{12}$ are each independently hydrogen, or a monovalent hydrocarbon group, at least two of $R^{12}$ are hydrogen atoms, at least one of $R^{12}$ is an aryl group, n is 1 to 100, $R^{13}$ are each independently hydrogen or a monovalent hydrocarbon group, at least two of $R^{13}$ are hydrogen atoms, at least one of $R^{13}$ is an aryl group, a is a positive number, b is 0 or a positive number, c is a positive number, and d is 0 or a positive number. For example, when the sum (a+b+c+d) thereof is adjusted to be 1, a is 0.1 to 0.8, b is 0 to 0.5, c is 0.1 to 0.8, and d is 0 to 0.2.

The compound of Formula 14 is a linear siloxane compound having at least two hydrogen atoms binding to a silicon atom. In Formula 14, n may be 1 to 100, 1 to 50, 1 to 25, 1 to 10, or 1 to 5.

The compound represented as the average empirical formula of Formula 15 may be a polysiloxane having a crosslinked structure.

In one embodiment, a molar ratio (H/Si) of a hydrogen atom (H) binding to a silicon atom with respect to all silicon atoms (Si) included in the silicon compound (C) may be 0.2 to 0.8 or 0.3 to 0.75. As the molar ratio is controlled to 0.2 or more, or 0.3 or more, curability of the composition can be excellently maintained, and as the molar ratio is controlled to 0.8 or less, or 0.75 or less, crack resistance and thermal and shock resistance can be excellently maintained.

The silicon compound (C) may include at least one aryl group, and thus at least one of $R^{12}$ in Formula 14 or at least one $R^{13}$ in Formula 15 may be an aryl group, for example, an aryl group having 6 to 21 carbon atoms, 6 to 18 carbon atoms, or 6 to 12 carbon atoms, or a phenyl group. Accordingly, the refractive index and hardness of the cured product can be effectively controlled. The aryl group may be present in such an amount that a molar ratio (Ar/Si) of the aryl group (Ar) with respect to all silicon atoms (Si) included in the polyorganosiloxane (C) is 0.5 to 1.5 or 0.5 to 1.3. As the molar ratio (Ar/Si) is controlled to 0.5 or more, the refractive index and hardness of the cured product can be maximized, and as the molar ratio (Ar/Si) is controlled to 1.5 or less, or 1.3 or less, the viscosity and crack resistance of the composition can be suitably maintained.

The compound (C) may have a viscosity at 25° C. of 0.1 cP to 100000 cP, 0.1 cP to 10000 cP, 0.1 cP to 1000 cP, or 0.1 cP to 300 cP. In the above range of viscosity, processability of the composition and hardness of the cured product can be excellently maintained.

In addition, the compound (C) may have, for example, a molecular weight of less than 2000, less than 1000, or less than 800. When the molecular weight is 1000 or more, strength of the cured product may be degraded. The lower limit of the molecular weight of the compound (C) is not particularly limited, and may be, for example, 250. In the compound (C), the molecular weight may be a weight average molecular weight, or a conventional molecular weight of the compound.

A method of preparing the compound (C) is not particularly limited, and may employ a conventional method of preparing a polyorganosiloxane known in the art, or a method similar to that of preparing the polyorganosiloxane (A).

A content of the compound (C) may be selected within the range of a molar ratio (H/Ak) of a hydrogen atom (H) binding to a silicon atom included in the compound (C) with respect to all aliphatic unsaturated bond-containing functional groups included in the curable composition, for example, all functional groups (Ak) containing an aliphatic unsaturated bond such as an alkenyl group included in the polyorganosiloxane (A) and/or (B) of 0.5 to 2.0 or 0.7 to 1.5. Within the above range of the molar ratio (H/Ak), the composition can exhibit excellent processability and workability before curing, and excellent crack resistance, hardness, thermal and shock resistance, and adhesiveness after curing, and does not cause whitening or surface stickiness even under harsh conditions.

The curable composition may further include a polyorganosiloxane including functional groups having an aliphatic unsaturated bond, for example, an alkenyl group and an epoxy group (hereinafter, referred to as "polyorganosiloxane (D)").

The polyorganosiloxane (D) may serve as, for example, a tackifier to enhance adhesive strength.

In one embodiment, the polyorganosiloxane (D) may be represented as an average empirical formula of Formula 16.

$$(R^{14}_3SiO_{1/2})_a(R^{14}_2SiO_{2/2})_b(R^{14}SiO_{3/2})_c(SiO_{4/2})_d \quad \text{[Formula 16]}$$

In Formula 16, $R^{14}$ are each independently an epoxy group, or a monovalent hydrocarbon group, at least one of $R^{14}$ is an alkenyl group, at least one of $R^{14}$ is an epoxy group, a, b, c and d are each independently 0 or a positive number, (c+d)/(a+b+c+d) may be 0.2 to 0.7, and c/(c+d) may be 0.8 or more. For example, when the sum of the molar ratios (a+b+c+d) is adjusted to be 1, a may be 0 to 0.7, b may be 0 to 0.5, c may be 0 to 0.8, and d may be 0 to 0.2.

In Formula 16, at least one or two of $R^{14}$ may be an alkenyl group. In one embodiment, the alkenyl group may be present in such an amount that a molar ratio (Ak/Si) of the alkenyl group (Ak) with respect to all silicon atoms (Si) included in the polyorganosiloxane (D) is 0.05 to 0.35, or 0.05 to 0.3. In such a molar ratio (Ak/Si), a cured product which exhibits excellent reactivity to another compound, forms a covalent bond with a silicon resin after curing, thereby having excellent adhesive strength, and has excellent physical properties such as shock resistance, can be provided.

In Formula 16, at least one of $R^{14}$ may also be an epoxy group. Accordingly, the strength and scratch resistance of the cured product can be suitably maintained, and excellent adhesiveness can be achieved. The epoxy group may be present in such an amount that a molar ratio (Ep/Si) of the epoxy group (Ep) with respect to all silicon atoms (Si) included in the polyorganosiloxane (D) may be 0.1 or more, or 0.2 or more. In such a molar ratio (Ep/Si), a crosslinked structure of the cured product can be suitably maintained, and heat resistance and adhesiveness can also be excellently maintained. The upper limit of the molar ratio (Ep/Si) is not particularly limited, and may be, for example, 1.0.

In the average empirical formula of Formula 16, a, b, c and d are molar ratios of respective siloxane units, and when the sum thereof is adjusted to be 1, a may be 0 to 0.7, b may be 0 to 0.5, c may be 0 to 0.8, d may be 0 to 0.2. Here, c and d may not be simultaneously 0. To maximize strength, crack resistance and thermal and shock resistance of the cured product, (c+d)/(a+b+c+d) may be controlled to 0.3 to 0.7, and c/(c+d) may be controlled to 0.8 or more. Here, the upper limit of c/(c+d) is not particularly limited and, for example, may be 1.0.

The polyorganosiloxane (D) may have a viscosity at 25° C. of 100 cP or more, or 100000 cP or more, and therefore processability before curing and hardness after curing can be suitably maintained.

The polyorganosiloxane (D) may have, for example, a molecular weight of 1000 or more, or 1500 or more. As the molecular weight is controlled to 1000 or more, or 1500 or more, a cured product having excellent processability and workability before curing, and excellent crack resistance, thermal and shock resistance and adhesiveness to a substrate after curing can be provided. The upper limit of the molecular weight is not particularly limited, and may be, for example, 20000.

A method of preparing the polyorganosiloxane (D) is not particularly limited, and may employ, for example, a conventional method of preparing a polyorganosiloxane known in the art, or a method similar to that of preparing the polyorganosiloxane (A).

The polyorganosiloxane (D) may be included in an amount of, for example, 0.2 to 10 parts by weight, or 0.5 to 5 parts by weight with respect to 100 parts by weight of a total weight of other compounds, for example, the polyorganosiloxane (A), the polyorganosiloxane (B), and/or the silicon compound (C), in the curable composition. In the above range, adhesiveness and transparency can be excellently maintained.

The curable composition may further include a hydrosilylation catalyst. The hydrosilylation catalyst may be used to stimulate a hydrosilylation reaction. As a hydrosilylation catalyst, any conventional component known in the art may be used. As such a catalyst, a platinum-, palladium- or rhodium-based catalyst may be used. For example, a platinum-based catalyst may be used in consideration of catalyst efficiency, and the platinum-based catalyst may be, but is not limited to, chloroplatinic acid, platinum tetrachloride, an olefin complex of platinum, an alkenyl siloxane complex of platinum or a carbonyl complex of platinum.

A content of the hydrosilylation catalyst is not particularly limited as long as the hydrosilylation catalyst is included at a catalytic amount, that is, an amount capable of serving as a catalyst. Conventionally, the hydrosilylation catalyst may be used at 0.1 ppm to 100 ppm, or 0.2 ppm to 10 ppm based on an atomic weight of platinum, palladium or rhodium.

The curable composition may further include a tackifier, alone or in combination with the polyorganosiloxane (D), in order to further enhance adhesiveness to various substrates. The tackifier is a component capable of improving self-adhesiveness to the composition or cured product, and can improve self-adhesiveness particularly to a metal and an organic resin.

The tackifier may be, but is not limited to, a silane having at least one or two functional groups selected from the group consisting of an alkenyl group such as a vinyl group, a (meth)acryloyloxy group, a hydrosilyl group (SiH group), an epoxy group, an alkoxy group, an alkoxysilyl group, a carbonyl group and a phenyl group; or an organic silicon compound such as a cyclic or linear siloxane having 2 to 30 silicon atoms, or 4 to 20 silicon atoms. In some embodiments, at least one or two of the tackifiers may be additionally mixed.

The tackifier may be included in the composition in a content of 0.1 parts by weight to 20 parts by weight with respect to 100 parts by weight of a total weight of other compounds, for example, the polyorganosiloxane (A), the polyorganosiloxane (B), and/or the silicon compound (C), in the curable composition, but the content may be suitably changed in consideration of desired improvement in adhesiveness.

The curable composition may further include at least one or two of additives including a reaction inhibitor such as 2-methyl-3-butyne-2-ol, 2-phenyl-3-1-butyne-2-ol, 3-methyl-3-penten-1-yne, 3,5-dimethyl-3-hexen-1-yne, 1,3,5,7-tetramethyl-1,3,5,7-tetrahexenylcyclotetrasiloxane or ethynylcyclohexane; an inorganic filler such as silica, alumina, zirconia or titania; a carbon-functional silane having an epoxy group and/or alkoxysilyl group, a partial hydrolysis-condensation product thereof or a siloxane compound; a thixotropic agent such as a haze-phase silica that can be used in combination with polyether; a conductivity providing agent such as metal powder of silver, copper or aluminum or various carbon materials; or a color adjusting agent such as a pigment or dye, as needed.

The curable composition may further include a fluorescent material. In this case, a kind of a fluorescent material which can be used is not particularly limited and, for example, a conventional kind of a fluorescent material applied to an LED package may be used to realize white light.

Another aspect of the present application provides a semiconductor element, for example, a photonic semiconductor element. The exemplary semiconductor element may be encapsulated by an encapsulant including a cured product of the curable composition.

Examples of a semiconductor element encapsulated by an encapsulant include a diode, a transistor, a thyristor, a photocoupler, a CCD, a solid-phase image pick-up diode, a monolithic IC, a hybrid IC, an LSI, a VLSI or a light-emitting diode (LED).

In one embodiment, the semiconductor element may be an LED.

The LED may be formed by stacking a semiconductor material on a substrate. The semiconductor material may be, but is not limited to, GaAs, GaP, GaAlAs, GaAsP, AlGaInP, GaN, InN, MN, InGaAlN or SiC. In addition, as the substrate, monocrystalline sapphire, spinel, SiC, Si, ZnO or GaN may be used.

In addition, to prepare the LED, when necessary, a buffer layer may be formed between a substrate and a semiconductor material. As the buffer layer, GaN or MN may be used. A method of stacking a semiconductor material on a substrate may be, but is not particularly limited to, MOCVD, HDVPE or liquid growth. In addition, a structure of the LED may be, for example, a monojunction including an MIS junction, a PN junction, and a PIN junction, a heterojunction, or a double heterojunction. In addition, the LED may be formed using a mono or multiple quantum well structure.

In one embodiment, an emission wavelength of the LED may be, for example, 250 to 550 nm, 300 to 500 nm, or 330 to 470 nm. The emission wavelength may refer to a main emission peak wavelength. As the emission wavelength of the LED is set in the above range, a white LED having a longer life span, high energy efficiency and high color expression can be obtained.

The LED may be encapsulated using the composition. In addition, the encapsulation of the LED may be performed only using the composition, and in some cases, another encapsulant may be used in combination with the composition. When two kinds of encapsulant are used in combination, after the encapsulation using the composition, the encapsulated LED may also be encapsulated with another encapsulant. Alternatively, the LED may be first encapsulated with the other encapsulant and then encapsulated again with the composition. As the other encapsulant, an epoxy resin, a silicon resin, an acryl resin, a urea resin, an imide resin, or glass may be used.

To encapsulate the LED with the composition, for example, a method including injecting the composition into a mold beforehand, dipping a lead frame to which the LED is fixed therein and curing the composition. Alternatively, a method including injecting the composition into a mold into which the LED is inserted and curing the composition may be used. As a method of injecting the composition, injection by a dispenser, transfer molding, or injection molding may be used. In addition, as other encapsulating methods, a method of dropping the composition on the LED, coating the composition by screen printing or using a mask, and curing the composition, and a method of injecting the composition into a cup in which the LED is disposed on its bottom by a dispenser and curing the composition may be included.

In addition, the composition may be used as a diamond material fixing the LED to a lead terminal or package, or a passivation layer or package substrate on the LED as needed.

When it is necessary to cure the composition, the curing is not particularly limited, and may be performed, for example, by maintaining the composition at a temperature of 60 to 200° C. for 10 minutes to 5 hours, or in 2 or more steps at suitable temperatures and for suitable amounts of time.

A shape of the encapsulant is not particularly limited and, for example, may be a bullet-shaped lens, planar shape, or thin film shape.

In addition, further enhancement of performance of the LED may be promoted according to conventional methods known in the art. To enhance performance, for example, a method of disposing a reflective layer or light collecting layer on a back surface of the LED, a method of forming a complementary coloring part on its bottom, a method of disposing a layer absorbing light having a shorter wavelength than the main emission peak on the LED, a method of encapsulating the LED and further molding the LED with a hard material, a method of inserting the LED into a through hole to be fixed, or a method of contacting the LED with a lead member by flip-chip contact to extract light from a direction of the substrate, may be used.

The LED may be effectively applied to, for example, backlights for liquid crystal displays (LCDs), lights, various kinds of sensors, light sources of a printer and a copy machine, light sources for an automobile gauge, signal lights, pilot lights, display devices, light sources of planar LEDs, displays, decorations, or various kinds of lighting.

Advantageous Effects

An exemplary curable composition exhibits excellent processability and workability. In addition, the curable composition exhibits excellent light extraction efficiency, hardness, thermal and shock resistance, moisture resistance, gas permeability, and adhesiveness, after curing. In addition, the curable composition can provide a cured product that exhibits long-lasting durability and reliability even under harsh conditions, and that does not cause whitening and surface stickiness. The composition can exhibit excellent light extraction efficiency, crack resistance, hardness, thermal and shock resistance, and adhesiveness, after curing.

MODE FOR CARRYING OUT THE INVENTION

Hereinafter, exemplary embodiments of the present application will be described in detail. However, the present application is not limited to the embodiments disclosed below and can be implemented in various forms. The following embodiments are described in order to enable those of ordinary skill in the art to embody and practice the present application.

Hereinafter, a curable composition according to the present application will be described in further detail with reference to Examples and Comparative Examples, but the range of the curable composition is not limited to the following Examples. Hereinafter, the abbreviation "Vi" refers to a vinyl group, the abbreviation "Ph" refers to a phenyl group, the abbreviation "Me" refers to a methyl group, and the abbreviation "Ep" refers to a 3-glycidoxypropyl group.

1. Evaluation of Characteristics of Element

Characteristics of an element were evaluated using a 5450 LED package manufactured of polyphthalamide (PPA). Specifically, a curable composition was dispensed in a PPA cup, maintained at 70° C. for 30 minutes, and then cured at 150° C. for 1 hour, thereby manufacturing a surface-mounting LED. Afterward, a test was performed according to the following method.

(1) Sulfur Exposure Test

The LED was put into a 200 L glass container, 0.2 g of sulfur powder was further added thereto, and the LED was maintained at 70° C. for 40 hours. Afterward, brightness was measured and a reduction rate of the brightness with respect to initial brightness was evaluated according to the following criteria.

<Evaluation Criteria>

A: 15% or less reduction rate of brightness with respect to initial brightness

B: more than 15% and also 20% or less reduction rate of brightness with respect to initial brightness C: more than 20% and also 25% or less reduction rate of brightness with respect to initial brightness D: more than 25% reduction rate of brightness with respect to initial brightness (2) Long-Term Reliability Test The manufactured LED was operated for 500 hours while 30 mA of current was supplied under conditions of 85° C. and a relative humidity of 85%. Subsequently, a reduction rate of brightness after operation with respect to initial brightness before operation was measured and evaluated according to the following criteria.

<Evaluation Criteria>

A: 5% or less reduction rate of brightness with respect to initial brightness

B: more than 5% and also 7% or less reduction rate of brightness with respect to initial brightness C: more than 7% reduction rate of brightness with respect to initial brightness Zone Name: A1,AMD,M Example 1

A curable composition capable of being cured by hydrosilylation was prepared by mixing compounds represented by Components A1, D1, C1, C2, and B1 (blending amount: Component A1: 70 g, Component D1: 200 g, Component C1 25 g, Component C2: 45 g, and Component B1: 4 g). Here, the polyorganosiloxane of Component A1 was prepared by reacting a mixture of octamethylcyclotetrasiloxane and octaphenylcyclotetrasiloxane with divinyltetramethyldisiloxane in the presence of a catalyst such as tetramethylammonium hydroxide (TMAH) at approximately 115° C. for approximately 20 hours. Afterward, a weight ratio of a cyclic compound (including the compound of Formula 6, in which $R^a$ and $R^b$ are all methyl groups, $R^c$ is a phenyl group, m and n are each in the range of 0 to 4, and m+n is in the range of 1 to 8) having a molecular weight measured by GPC of not more than 800 was designed to be approximately 7% by a known purifying method and used to prepare the curable composition. Subsequently, a catalyst (platinum(0)-1,3-divinyl-1,1,3,3-tetramethyldisiloxane) was blended into the composition in a content of Pt (0) of 10 ppm and uniformly mixed, thereby preparing the curable composition.

| | |
|---|---|
| $(ViMe_2SiO_{1/2})_2(Me_2SiO_{2/2})_6(Ph_2SiO_{2/2})_{10}$ | [Component A1] |
| $(ViMe_2SiO_{1/2})_2(PhSiO_{3/2})_6$ | [Component D1] |
| $(HMe_2SiO_{1/2})_2(MePhSiO_{2/2})_{1.5}$ | [Component C1] |
| $(HMe_2SiO_{1/2})_2(Ph_2SiO_{2/2})_{1.5}$ | [Component C2] |
| $(ViMe_2SiO_{1/2})_2(EpSiO_{3/2})_3(MePhSiO_{2/2})_{10}(Ph_2SiO_{2/2})_{15}$ | [Component B1] |

Example 2

A curable composition capable of being cured by hydrosilylation was prepared by mixing compounds represented by Component A1, D1, C2, B2 (blending amount: Component A1: 70 g, Component D1: 200 g, Component C2: 70 g, and Component B2: 4 g). Here, the polyorganosiloxane of Component A1 was prepared by reacting a mixture of octamethylcyclotetrasiloxane and octaphenylcyclotetrasiloxane with divinyltetramethyldisiloxane in the presence of a catalyst such as tetramethylammonium hydroxide (TMAH) at approximately 115° C. for approximately 20 hours. Afterward, a weight ratio of a cyclic compound (including the compound of Formula 6, in which $R^a$ and $R^b$ are all methyl groups, $R^c$ is a phenyl group, m and n are each in the range of 0 to 4, and m+n is in the range of 1 to 8) having a molecular weight measured by GPC of not more than 800 was designed to be approximately 5% by a known purifying method and used to prepare the curable composition. Subsequently, a catalyst (platinum(0)-1,3-divinyl-1,1,3,3-tetramethyldisiloxane) was blended into the composition in a content of Pt(0) of 10 ppm and uniformly mixed, thereby preparing the curable composition.

| | |
|---|---|
| $(ViMe_2SiO_{1/2})_2(Me_2SiO_{2/2})_6(Ph_2SiO_{2/2})_{10}$ | [Component A1] |
| $(ViMe_2SiO_{1/2})_2(PhSiO_{3/2})_6$ | [Component D1] |
| $(HMe_2SiO_{1/2})_2(Ph_2SiO_{2/2})_{1.5}$ | [Component C2] |
| $(ViMe_2SiO_{1/2})_2(EpSiO_{3/2})_3(MePhSiO_{2/2})_{20}$ | [Component B2] |

Example 3

A curable composition capable of being cured by hydrosilylation was prepared by mixing compounds represented by Components A2, D2, C2, B2, (blending amount: Component A2: 70 g, Component D2: 200 g, Component C2: 70 g, and Component B2: 4 g). Here, the polyorganosiloxane of Component A2 was prepared by reacting a mixture of tetramethyltetraphenylcyclotetrasiloxane, octamethylcyclotetrasiloxane, and octaphenylcyclotetrasiloxane with divinyltetramethyldisiloxane in the presence of a catalyst such as tetramethylammonium hydroxide (TMAH) at approximately 115° C. for approximately 20 hours. Afterward, a weight ratio of a cyclic compound (including the compound of Formula 6, in which $R^a$ and $R^b$ are all methyl groups, $R^c$ is a phenyl group, m and n are each in the range of 0 to 4, and m+n is in the range of 1 to 8) having a molecular weight measured by GPC of not more than 800 was designed to be approximately 7% by a known purifying method and used to prepare the curable composition. Subsequently, a catalyst (platinum(0)-1,3-divinyl-1,1,3,3-tetramethyldisiloxane) was blended into the composition in a content of Pt(0) of 10 ppm and uniformly mixed, thereby preparing the curable composition.

(ViMe$_2$SiO$_{1/2}$)$_2$(Me$_2$SiO$_{2/2}$)$_5$(Ph$_2$SiO$_{2/2}$)$_{18}$(MePhSiO$_{2/2}$)$_2$     [Component A2]

(ViMe$_2$SiO$_{1/2}$)$_2$(PhSiO$_{3/2}$)$_7$     [Component D2]

(HMe$_2$SiO$_{1/2}$)$_2$(Ph$_2$SiO$_{2/2}$)$_{1.5}$     [Component C2]

(ViMe$_2$SiO$_{1/2}$)$_2$(EpSiO$_{3/2}$)$_3$(MePhSiO$_{2/2}$)$_{20}$     [Component B2]

Comparative Example 1

A curable composition capable of being cured by hydrosilylation was prepared by mixing compounds represented by Components I, D1, C1, C2, and B1 (blending amount: Component I: 70 g, Component D1: 200 g, Component C1: 45 g, Component C2: 25 g and Component B1: 4 g). Here, the compound of Formula I was prepared by controlling a composition ratio of raw materials by a similar method to that for Component A in Example 1, and a low molecular weight component was removed before application. Subsequently, a catalyst (platinum(0)-1,3-divinyl-1,1,3,3-tetramethyldisiloxane) was blended into the composition in a content of Pt(0) of 10 ppm and uniformly mixed, thereby preparing the curable composition.

(ViMe$_2$SiO$_{1/2}$)$_2$(Me$_2$SiO$_{2/2}$)$_{15}$(Ph$_2$SiO$_{2/2}$)$_{10}$     [Component I]

(ViMe$_2$SiO$_{1/2}$)$_2$(PhSiO$_{3/2}$)$_6$     [Component D1]

(HMe$_2$SiO$_{1/2}$)$_2$(MePhSiO$_{2/2}$)$_{1.5}$     [Component C1]

(HMe$_2$SiO$_{1/2}$)$_2$(Ph$_2$SiO$_{2/2}$)$_{1.5}$     [Component C2]

(ViMe$_2$SiO$_{1/2}$)$_2$(EpSiO$_{3/2}$)$_3$(MePhSiO$_{2/2}$)$_{10}$(Ph$_2$SiO$_{2/2}$)$_{15}$     [Component B1]

Comparative Example 2

A curable composition capable of being cured by hydrosilylation was prepared by mixing compounds represented by Components J, D1, C2, and B2 (blending amount: Component J: 70 g, Component D: 200 g, Component C2: 70 g, and Component B2: 4 g). Here, the compound of Component J was prepared by controlling a composition ratio of raw materials by a similar method to that for Component A1 in Example 1, and a low molecular weight component was removed before application. Subsequently, a catalyst (platinum(0)-1,3-divinyl-1,1,3,3-tetramethyldisiloxane) was blended into the composition in a content of Pt(0) of 10 ppm and uniformly mixed, thereby preparing the curable composition.

(ViMe$_2$SiO$_{1/2}$)$_2$(Me$_2$SiO$_{2/2}$)$_{16}$(Ph$_2$SiO$_{2/2}$)$_{10}$     [Component J]

(ViMe$_2$SiO$_{1/2}$)$_2$(PhSiO$_{3/2}$)$_6$     [Component D1]

(HMe$_2$SiO$_{1/2}$)$_2$(Ph$_2$SiO$_{2/2}$)$_{1.5}$     [Component C2]

(ViMe$_2$SiO$_{1/2}$)$_2$(EpSiO$_{3/2}$)$_3$(MePhSiO$_{2/2}$)$_{20}$     [Component B2]

Comparative Example 3

A curable composition capable of being cured by hydrosilylation was prepared by mixing compounds represented by Components K, I, C1, and B2 (blending amount: Component K: 70 g, Component I: 200 g, Component C1: 70 g, and Component B2: 4 g). Subsequently, a catalyst (platinum(0)-1,3-divinyl-1,1,3,3-tetramethyldisiloxane) was blended into the composition in a content of Pt(0) of 10 ppm and uniformly mixed, thereby preparing the curable composition.

(ViMe$_2$SiO$_{1/2}$)$_2$(Ph$_2$SiO$_{2/2}$)$_5$(MePhSiO$_{2/2}$)$_{15}$     [Component K]

(ViMe$_2$SiO$_{1/2}$)$_2$(Me$_2$SiO$_{2/2}$)$_{0.5}$((PhSiO$_{3/2}$)$_6$     [Component I]

(HMe$_2$SiO$_{1/2}$)$_2$(MePhSiO$_{2/2}$)$_{1.5}$     [Component C1]

(ViMe$_2$SiO$_{1/2}$)$_2$(EpSiO$_{3/2}$)$_3$(MePhSiO$_{2/2}$)$_{20}$     [Component B2]

Physical properties of the curable compositions prepared in the Examples and Comparative Examples were measured and summarized in Table 1.

TABLE 1

|  | Sulfur exposure test | Long-term reliability |
|---|---|---|
| Example 1 | B | B |
| Example 2 | A | A |
| Example 3 | A | A |
| Comparative Example 1 | D | C |
| Comparative Example 2 | D | C |
| Comparative Example 3 | D | C |

What is claimed is:

1. A curable composition, comprising:
   (A) a linear structure polyorganosiloxane comprising a functional group having an aliphatic unsaturated bond, a siloxane unit of Formula 2 and a siloxane unit of Formula 3, in which a ratio of the siloxane unit of Formula 3 with respect to the entire bifunctional siloxane units is 60% or more, and a ratio of the siloxane unit of Formula 3 with respect to bifunctional siloxane units including an aryl group is 70% or more;
   (B) a partially-crosslinked structure polyorganosiloxane having an average empirical formula of Formula 4 or Formula 5;
   (C) a silicon compound comprising a hydrogen atom binding to a silicon atom; and
   (D) a polyorganosiloxane having an average empirical formula of Formula 13:

(R$^1$R$^2$SiO$_{2/2}$)     [Formula 2]

(R$^3$$_2$SiO$_{2/2}$)     [Formula 3]

wherein R$^1$ and R$^2$ are each independently an epoxy group or a monovalent hydrocarbon group, and R$^3$ is an aryl group;

(R$^{11}$SiO$_{1/2}$)$_a$(R$^{11}$$_2$SiO$_{2/2}$)$_b$(R$^{11}$SiO$_{3/2}$)$_c$(SiO$_{4/2}$)$_d$     [Formula 13]

wherein the R$^{11}$'s are each independently an epoxy group or a monovalent hydrocarbon group, with the proviso that at least one of the R$^{11}$'s is an alkenyl group and at least one of the R$^{11}$'s is an aryl group; and a is a positive number, b is 0 or a positive number, c is a positive number, and d is 0 or a positive number, b/(b+c+d) is less than 0.65, and c/(c+d) is 0.8 or more;

(R$^4$$_3$SiO$_{1/2}$)$_a$(R$^4$$_2$SiO$_{2/2}$)$_b$(R$^4$SiO$_{3/2}$)$_c$(SiO$_{4/2}$)$_d$     [Formula 4]

wherein R$^4$'s are each independently an epoxy group or a monovalent hydrocarbon group, with the proviso that at least one of R$^4$'s is an alkenyl group, at least one of R$^4$'s is an aryl group, and R$^4$ in tri-functional siloxane units is an epoxy group; and a, b and c are each a positive number, d are each 0 or a positive number, and b/(b+c+d) is 0.7 to 0.97;

   [Formula 5]

wherein $R^5$ is a monovalent hydrocarbon group, $R^6$ is an alkyl group having 1 to 4 carbon atoms, $R^7$ and $R^8$ are each independently an alkyl group, an alkenyl group, or an aryl group, $R^9$ is an aryl group, $R^{10}$ is an epoxy group, e, f, g, and h are a positive number, and (f+g)/(f+g+h) is 0.7 to 0.97.

2. The curable composition according to claim 1, wherein the ratio of the siloxane unit of Formula 3 with respect to the entire bifunctional siloxane units in the polyorganosiloxane is more than 65%.

3. The curable composition according to claim 1, wherein the $R^1$ and $R^2$ in Formula 2 are each independently an alkyl group.

4. The curable composition according to claim 1, further comprising a cyclic compound which comprises a compound of Formula 6 and of which a weight average molecular weight is 800 or less:

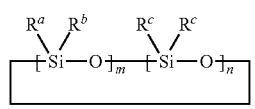   [Formula 6]

wherein $R^a$ and $R^b$ are each independently an epoxy group or a monovalent hydrocarbon group, $R^c$ is an aryl group, m is 0 to 10, n is 0 to 10, and the sum (m+n) of m and n is 2 to 20.

5. The curable composition according to claim 4, wherein $R^a$ and $R^b$ in Formula 6 are each independently an alkyl group.

6. The curable composition according to claim 4, wherein a weight ratio of the cyclic compound in the curable composition is 10 weight % or less.

7. The curable composition according to claim 1, wherein (A) the linear structure polyorganosiloxane is a polymerization product of a mixture comprising a compound represented by Formula 7:

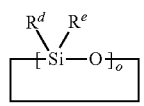   [Formula 7]

wherein $R^d$ and $R^e$ are each independently a monovalent hydrocarbon group, and o is 3 to 6.

8. The curable composition according to claim 1, wherein (A) the linear structure polyorganosiloxane is a polymerization product of a mixture comprising a compound of Formula 8 and a compound of Formula 9:

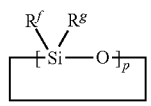   [Formula 8]

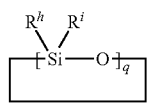   [Formula 9]

wherein $R^f$ and $R^g$ are each an alkyl group, $R^h$ and $R^i$ are each an aryl group, p is a number of 3 to 6, and q is a number of 3 to 6.

9. The curable composition according to claim 1, wherein (B) the partially crosslinked structure polyorganosiloxane is a polymerization product of a mixture comprising a compound represented by Formula 7 and a polyorganosiloxane having an average empirical formula of Formula 10 or 11:

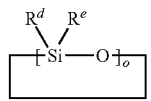   [Formula 7]

$[R^j SiO_{3/2}]$   [Formula 10]

$[R^k R^l{}_2 SiO_{1/2}]_p [R^m SiO_{3/2}]_q$   [Formula 11]

wherein $R^d$ and $R^e$ are each independently a monovalent hydrocarbon group, and o is 3 to 6, and wherein $R^j$, $R^k$ and $R^m$ are each independently an epoxy group or a monovalent hydrocarbon group, $R^l$ is an alkyl group having 1 to 4 carbon atoms, p is 1 to 3, and q is 1 to 10.

10. The curable composition according to claim 1, wherein the silicon compound is a compound of Formula 14, or a compound having an average empirical formula of Formula 15:

$R^{12}{}_3 SiO(R^{12}{}_2 SiO)_n SiR^{12}{}_3$   [Formula 14]

$(R^{13}{}_3 SiO_{1/2})_a (R^{13}{}_2 SiO_{2/2})_b (R^{13} SiO_{3/2})_c (SiO_2)_d$   [Formula 15]

wherein $R^{12}$'s are each independently hydrogen, or a monovalent hydrocarbon group, with the proviso that at least two of $R^{12}$'s are hydrogen atoms and at least one of $R^{12}$'s is an aryl group; and n is 1 to 100; $R^{13}$'s are each independently hydrogen or a monovalent hydrocarbon group, with the proviso that at least two of $R^{13}$'s are hydrogen atoms and at least one of $R^{13}$'s is an aryl group; and a is a positive number, b is 0 or a positive number, c is a positive number, and d is 0 or a positive number.

11. A photonic semiconductor encapsulated by the cured curable composition of claim 1.

12. A liquid crystal display comprising the photonic semiconductor of claim 11 in a backlight unit.

13. A lighting apparatus comprising the photonic semiconductor of claim 11.

* * * * *